United States Patent [19]

Yoshizawa et al.

[11] 4,145,750
[45] Mar. 20, 1979

[54] FIELD ACCESS MAGNETIC BUBBLE MEMORY DEVICE

[75] Inventors: Shigeru Yoshizawa; Yutaka Sugita, both of Tokorozawa; Nobuo Saito, Mitaka; Yuji Arai, Fujisawa; Nakahiko Yamaguchi, Sayama, all of Japan

[73] Assignees: Hitachi, Ltd.; Nippon Telegraph and Telephone Public Corporation, both of Japan

[21] Appl. No.: 816,928

[22] Filed: Jul. 19, 1977

[30] Foreign Application Priority Data

Jul. 23, 1976 [JP] Japan .................................. 51-87262

[51] Int. Cl.² .............................................. G11C 19/08
[52] U.S. Cl. ............................................ 365/6; 365/30
[58] Field of Search ........................................ 365/6, 30

[56] References Cited

U.S. PATENT DOCUMENTS

| 3,763,478 | 10/1973 | Yoshizawa et al. | 365/6 |
| 4,025,911 | 5/1977 | Bobeck et al. | 365/30 |

Primary Examiner—James W. Moffitt
Attorney, Agent, or Firm—Craig & Antonelli

[57] ABSTRACT

A field access magnetic bubble memory device including a memory chip applied with an in-plane magnetic field at need is disclosed. At a transient stop operation of the device before its interrupted state, an in-plane field is removed after it has been held for a predetermined period following the cessation of rotation thereof. The in-plane field may be increased upon the cessation of rotation thereof. At a transient start operation of the device after the interrupted state, an in-plane field having no rotation and the same direction as at the transient stop operation is applied for a predetermined period before the initiation of rotation thereof. The applied in-plane field may be increased upon the initiation of rotation thereof.

14 Claims, 58 Drawing Figures

F I G. 15A 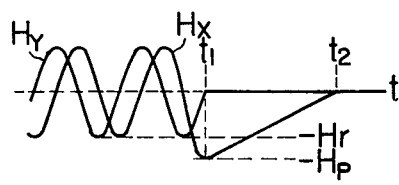
F I G. 15B 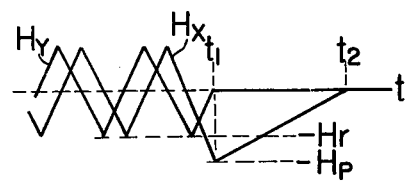
F I G. 15C 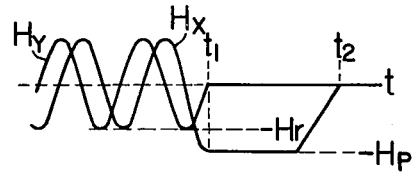
F I G. 15D 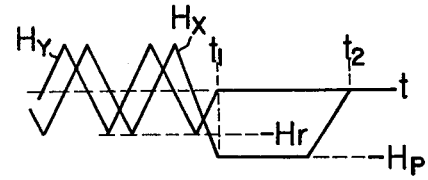
F I G. 15E 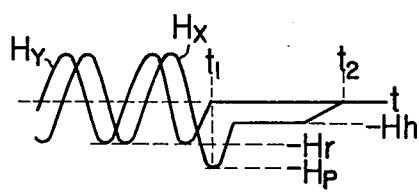
F I G. 15F 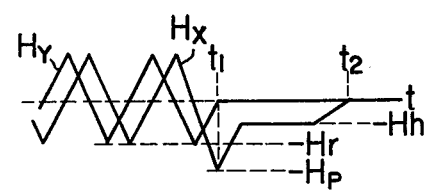
F I G. 15G 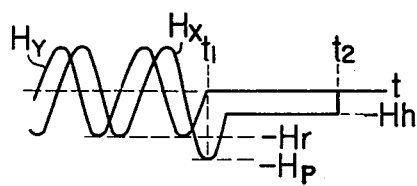
F I G. 15H 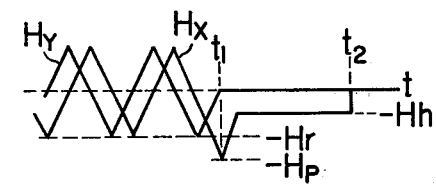
F I G. 16A 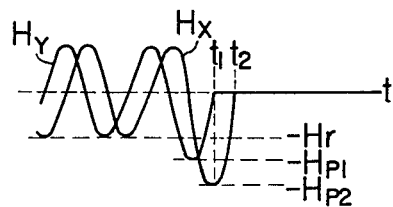
F I G. 16B 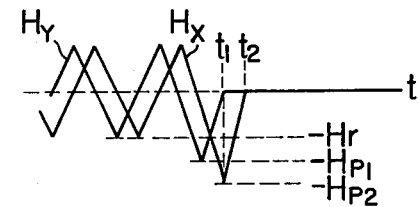

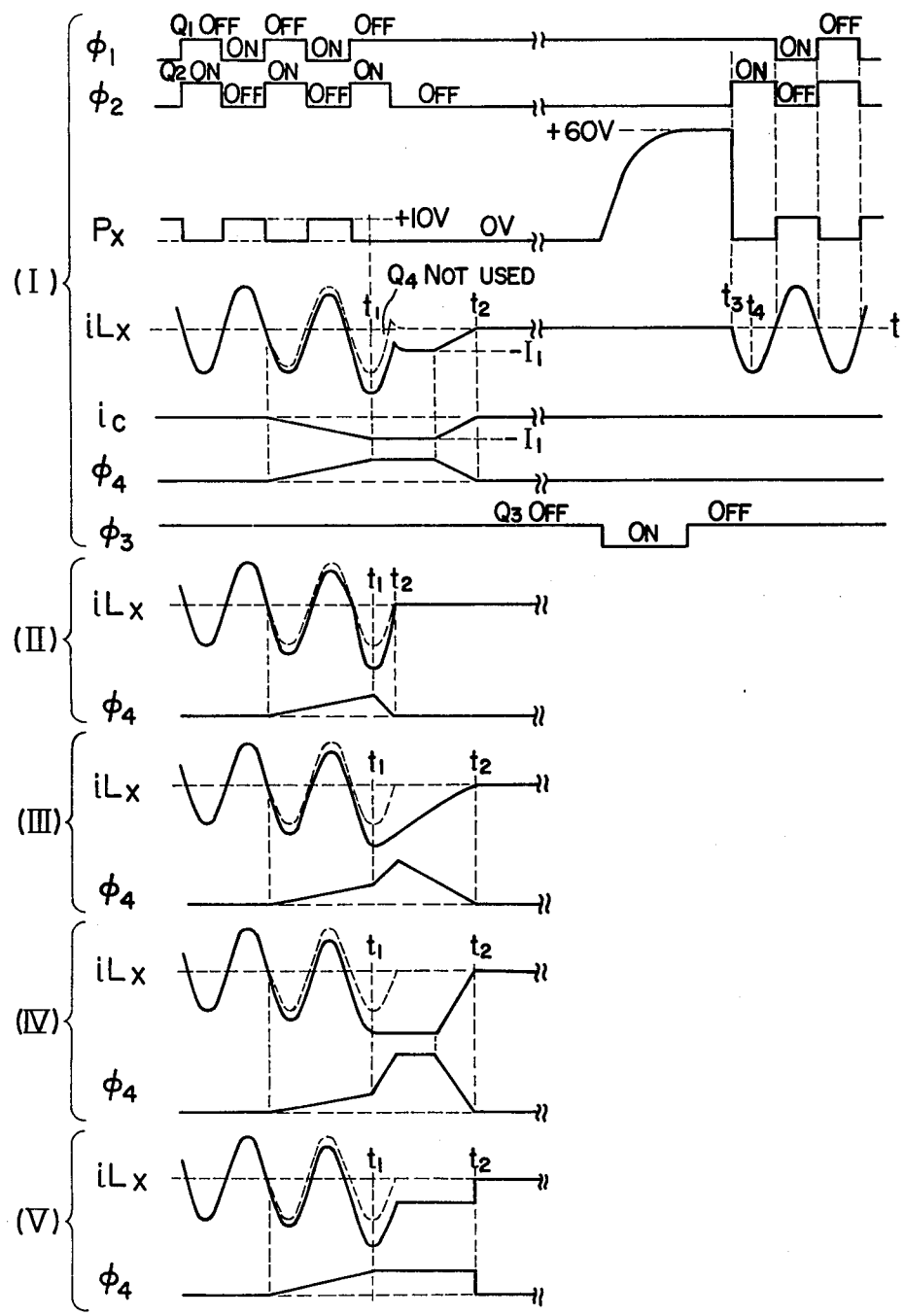

FIELD ACCESS MAGNETIC BUBBLE MEMORY DEVICE

LIST OF PRIOR ART REFERENCES (37CFR 1.56(a))

The following references are cited to show the state of the art:
(1) Japanese Patent Application Laid-Open No. 88438/74, Hiroshima and Yoshizawa, Aug. 3, 1974
(2) I. S. Gergis, T. T. Chen and L. R. Tocci "The effect of dc in plane field on the operation of field access bubble memory devices," IEEE Trans on Magnetics, Vol. MAG-12, No. 1, pp 7 ~ 14, January 1976
(3) Maekawa, Komatsu and Takai, "The investigation on the driving of rotating magnetic field for magnetic bubbles," the research materials by the Japanese joint research committee for electronic devices and magnetic materials, March 1974

The present invention relates to a field access magnetic bubble memory device using an in-plane rotating magnetic field and more particularly to transient stop and start operations of such a device before and after its interrupted state.

The "transient stop operation" of the device referred to in the specification includes at least a period from the cessation of rotation of an in-plane magnetic field to the removal of the in-plane field before the interrupted state of the device. The "transient start operation" of the device includes at least a period from the application of an in-plane magnetic field to the initiation of rotation of the in-plane field after the interrupted state of the device.

A conventional field access magnetic bubble memory device using an in-plane rotating magnetic field comprises a memory chip including a layer of magnetic material provided on a non-magnetic substrate and magnetic bubble transfer paths formed on the magnetic material layer. A typical example of the magnetic bubble transfer paths is a T-bar pattern of magnetically soft material such as permalloy which includes alternating bar and T-shaped segments. Instead of the T-bar pattern may be used a well known suitable pattern such as so-called Y-bar, Y—Y or chevron pattern. The memory chip is surrounded by a drive coil assembly which usually includes X- and Y-direction drive coils for generating an in-plane rotating magnetic field. The drive coil assembly is encompassed by a magnet assembly for generating a biasing magnetic field which is perpendicular to the magnetic material layer of the memory chip and forms stabilized magnetic bubbles in the magnetic material layer.

The operation of the magnetic bubble memory may be interrupted at need. In that case, the contents stored before the interruption must be reserverd throughout the transient stop and start operations. The memory having such a property is called a non-volatile memory. The Japanese Pat. Application No. 129399/72 laid open on Aug. 3, 1974 under the Japanese Patent Application Laid-Open No. 88438/74 discloses a conventional technique for achieving this purpose in the case where the combination of X- and Y-direction magnetic field components $H_X$ and $H_Y$ of sinusoidal waveforms shifted in phase from each other by 90° is used as an in-plane rotating magnetic field. According to the disclosed technique, a transient stop operation before an interrupted state is carried out in such a manner that one of the $H_X$ and $H_Y$ components, for example, the $H_Y$ component is removed for the cessation of rotation of the in-plane field when the $H_Y$ component has reached its magnitude of zero and the $H_X$ component is removed when the $H_X$ component has reached its magnitude of zero after the lapse of the ¼ cycle of the normal operation of the device following the cessation of rotation of the in-plane field. At a transient start operation after the interrupted state, the component $H_X$ having the same direction as at the transient stop operation is applied and the component $H_Y$ having its direction opposite to that just before the cessation of rotation of the in-plane field is applied for the initiation of rotation of the in-plane field after the lapse of the ¼ cycle of the normal operation of the device following the application of the $H_X$ component. However, there is a problem that the margin of a biasing magnetic field in such transient stop and start operations is smaller than that in the normal operation, i.e. during the continuous rotation of the in-plane field.

The above-described Japanese Patent Application Laid-Open No. 88438/74 also discloses methods for preventing the decrease in the margin of a biasing field at the transient stop/start operation. According to one of the disclosed methods, the in-plane field or one of the $H_X$ and $H_Y$ component is held during the transient stop operation and even during the interrupted state of the device as it was upon the cessation of rotation of the in-plane field. At the transient start operation, the held in-plane field is directly rotated. In this method, however, current must be flown through the drive coil even during the interrupted state. According to the disclosed other method, the transient start operation is carried out in such a manner that the applied in-plane field is slowly increased and thereafter rotated. However, this method takes too long access time.

An object of the present invention is to provide a field access magnetic bubble memory device in which the margin of a biasing magnetic field at the transient stop/start operation is improved without imposing any severe restriction on the tolerances of a memory chip and a drive circuit.

The present invention is directed to a field access magnetic bubble memory device comprising a memory chip and an in-plane magnetic field generating means for generating in the memory chip an in-plane magnetic field which cyclically rotates during normal operations of the device and is held without rotating and with the same direction during transient stop and start operations of the device before and after an interrupted state of the device between the normal operations. According to the present invention, the in-plane field at the transient stop operation has its magnitude which gradually decreases over a period exceeding the ¼ cycle of the normal operation, its magnitude which is constant for a predetermined period, or its magnitude which is larger than that at the normal operation.

Now, the present invention will be explained in conjunction with the accompanying drawings, in which:

FIGS. 15A to 15H illustrate stop/start operations in which a magnitude of the in-plane field is increased only upon the cessation of rotation thereof and a holding field is thereafter applied for a predetermined period;

FIGS. 16A and 16B illustrate stop/start operations in which a magnitude of the in-plane field is increased at the phase 90° before the instant of the cessation of rotation thereof;

FIG. 27 shows waveforms useful in explaining the operation of the circuit shown in FIG. 26;

Prior to the description of the embodiments of the present invention, the conventional methods and the associated problems will be explained with the aid of FIGS. 1 to 7.

Figure 1:
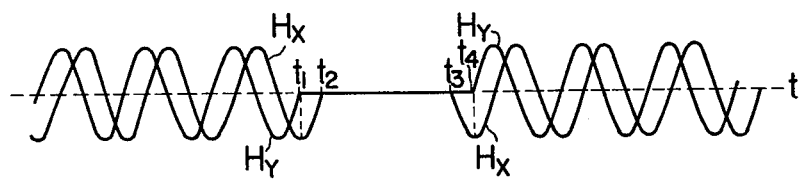
FIG. 1 illustrates a conventional stop/start operation using two magnetic field components $H_X$ and $H_Y$ of sinusoidal waveforms shifted in phase from each other by 90°.
Figure 2:
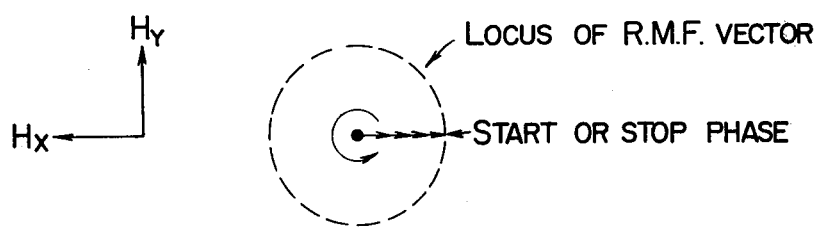
FIG. 2 shows the locus of the vector of an in-plane rotating magnetic field generated by the combination of the two field components $H_X$ and $H_Y$ in FIG. 1.
Figure 4:
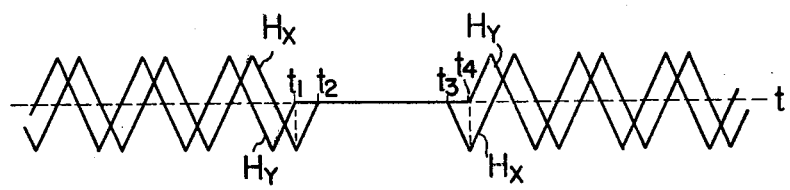
FIG. 4 illustrates a conventional stop/start operation using two field components $H_X$ and $H_Y$ of triangular waveforms shifted in phase from each other by 90°.

The conventional stop/start operation has been performed in the manner as shown in FIG. 1 or 4. FIG. 1 showing the case where two sinusoidally varying magnetic field components $H_X$ and $H_Y$ shifted in phase from each other by 90°, is disclosed the Japanese Pat. application Laid-Open No. 88438/74. In this case, $H_Y$ vanishes at the time $t_1$ and is kept at zero from that time instant forward so that the rotation of the in-plane magnetic field having rotated counterclockwise before the time $t_1$ as shown in FIG. 2 is ceased at the time $t_1$, pointing to the negative direction of $H_X$. After the ¼ cycle of the normal operation, $H_X$ vanishes at the time $t_2$ and is kept at zero thereafter. The in-plane field kept still pointing to the negative direction of $H_X$ gradually decreases in its vector norm until it vanishes completely at the time $t_2$ as shown in FIG. 2. For the transient start operation, $H_X$ starts at the time $t_3$ varying sinusoidally in the negative direction and reaches its maximum magnitude at the time $t_4$ when $H_Y$ also starts varying sinusoidally in the positive direction. As a result, the in-plane field rotates counterclockwise after the time $t_4$.

Figure 3:
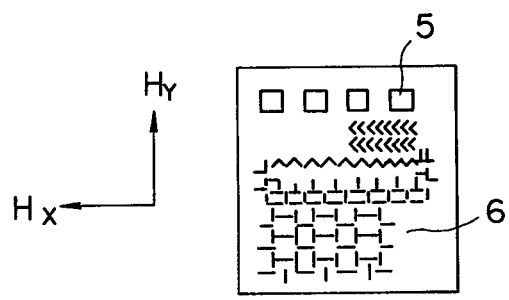
FIG. 3 shows the relationship between the coordinate of the rotating field vector and the memory chip arrangement.

Thus, the direction of the in-plane field applied at the transient start operation must be identical to that of the in-plane magnetic field from its rotation cessation to its removal at the transient stop operation. There exists a certain relationship between that field direction and the memory chip arrangement, i.e. the directions of the T-bar patterns in the chip, and FIG. 3 shows an example thereof. In FIG. 3, reference numerals 5 and 6 respectively indicate bonding pads and a T-bar pattern of minor loops.

Figure 5:
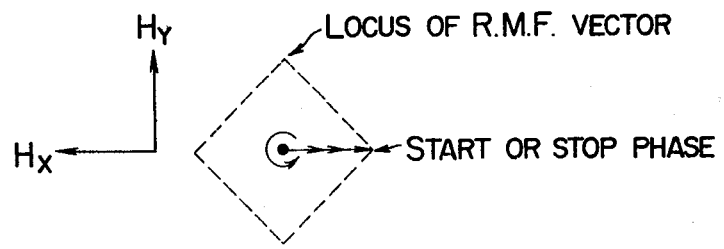
FIG. 5 shows the locus of the vector of an in-plane rotating field generated by the combination of the two field component $H_X$ and $H_Y$ in FIG. 4.

FIG. 4 shows the case where magnetic field components for forming an in-plane rotating magnetic field have triangular waveforms. The vector of the in-plane rotating magnetic field in this case describes a locus of square as shown in FIG. 5.

However, detailed experiments have revealed that the margin of a biasing magnetic field at the stop/start operation is smaller than at the normal operation, i.e. during the continuous rotation of the in-plane field and also that if a constant in-plane magnetic field having a small magnitude is applied with its direction opposite to that of the in-plane field upon the cessation of rotation thereof, the bias field margin is considerably decreased. In connection therewith, one can refer to I. S. Gergis, T. T. Chen and L. R. Tocci "The effect of dc in-plane field on the operation of field access bubble memory devices", IEEE Trans on Magnetics, Vol. MAG-12, No. 1, pp 7 ~ 14, Jan. 1976.

Figure 6:
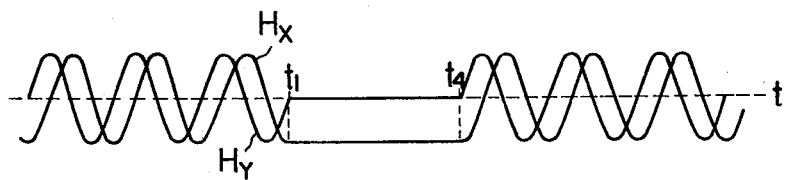
FIG. 6 illustrates a stop/start operation in which the in-plane field is held during a period from the cessation of rotation thereof to the initiation of rotation thereof.
Figure 7:
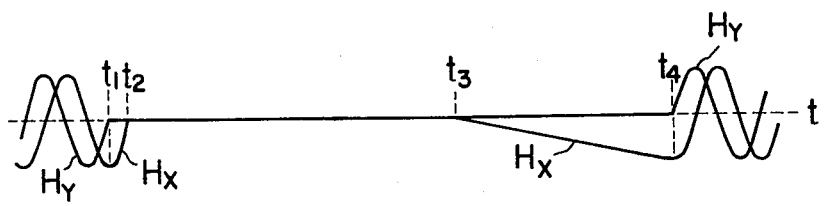
FIG. 7 illustrates a conventional stop/start operation in which the in-plane field is slowly applied.

In order to prevent the decrease in the bias field margin at the stop/start operation, the abovedescribed Japanese Pat. application Laid-Open No. 88438/74 shows a method in which the in-plane field is held present during the transient stop operation and even during the interrupted state of the device and the held in-plane field is directly rotated at the transient start operation, as shown in FIG. 6. This method, however, requires current to flow through the drive coil even during the interrupted state of the device, i.e. during the period in which the rotation of the in-plane field is ceased. The Japanese Pat. application Laid-Open No. 88438/74 also shows a method in which the in-plane field applied at the transient start operation is slowly increased to the rated level assumed at the continuous rotating operation and thereafter caused to initiate the rotation thereof, as shown in FIG. 7. This method, however, has a drawback that an access time is too long since the in-plane field in only gradually increased after the demand for memory reference.

The present inventors have revealed the facts listed in the following items (1) to (10) as a result of repeated experiments of fabricating and measuring memory chips.

(1)—The difference between the bias field margins at the normal operation and the stop/start operation can be eliminated or decreased if a constant in-plane field is always applied in the direction identical to that of the in-plane rotating field upon the cessation of rotation thereof. However, if the constant in-plane field has too great magnitude, the bias field margin at the normal operation is lowered.

Figure 8:
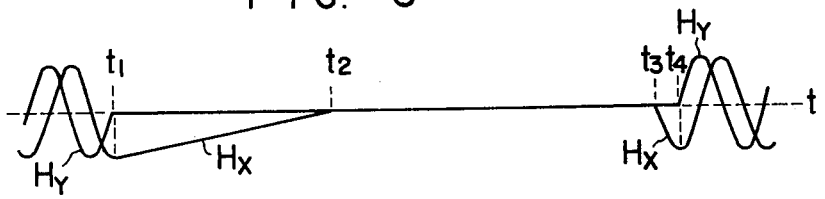
FIG. 8 illustrates a stop/start operation in which the in-plane field is slowly decreased to zero after the cessation of rotation thereof.
Figure 9:
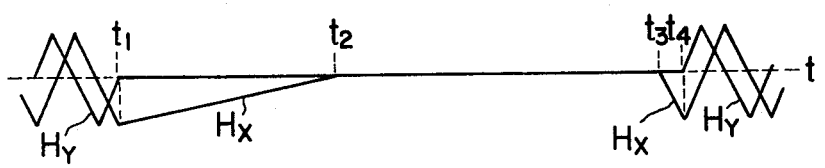
FIG. 9 illustrates the same stop/start operation as shown in FIG. 8, except the use of two magnetic field components of triangular waveforms.
Figure 10A:
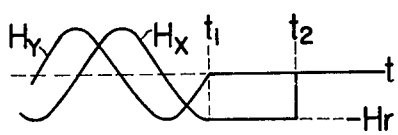
FIGS. 10A and 10B illustrate stop/start operations in which a holding field having its magnitude equal to the peak value $H_r$ of the in-plane field at the continuous rotating operation is applied for a predetermined period.
Figure 10B:
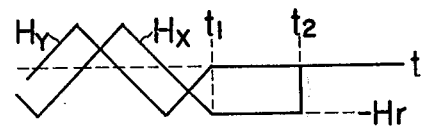
Figure 11A:
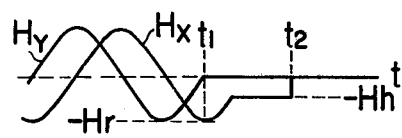
FIGS. 11A and 11B illustrate the same stop/start operations as shown in FIGS. 10A and 10B, except that the holding field $H_h$ has its magnitude smaller than $H_r$.
Figure 11B:
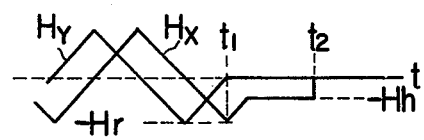
Figure 12A:
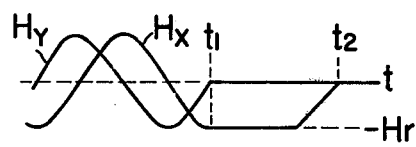
FIGS. 12A and 12B illustrate the same stop/start operations as shown in FIGS. 10A and 10B, except that the holding field is slowly removed.
Figure 12B:
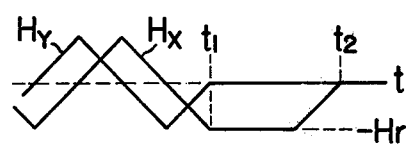
Figure 13A:
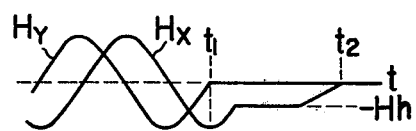
FIGS. 13A and 13B illustrate the same stop/start operations as shown in FIGS. 11A and 11B, except that the holding filed is slowly removed.
Figure 13B:
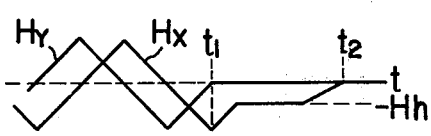

(2)—If the in-plane field is slowly decreased only during the transient stop operation as shown in FIG. 8 or 9 instead of the method shown in FIG. 7, the decrease in the bias field margin can be prevented. In that case, the transient start operation may employ the manner shown in FIG. 1 or 4. Thus, an access time can be shortened. In this method, it is necessary that a period over which the in-plane field gradually decreases should exceed the ¼ cycle of the normal operation.

(3)—As regards a method of reducing the in-plane field to zero, the in-plane field may be removed after a constant in-plane field $H_r$ having its magnitude equal to that of the in-plane field at the normal operation or a constant in-plane field $H_h$ having its magnitude smaller than that of the in-plane field at the normal operation has been held for a predetermined period, as shown in FIGS. 10A, 10B, 11A or 11B.

(4)—If the in-plane field is rapidly decreased, the bias field margins in some chips are decreased. The decrease in the margins in those chips can be prevented by resorting to the manners shown in FIGS. 12A, 12B, 13A or 13B.

Figure 14A:
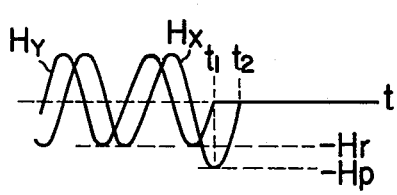
FIGS. 14A and 14B illustrate stop/start operations in which a magnitude of the in-plane field is increased only upon the cessation of rotation thereof.
Figure 14B:
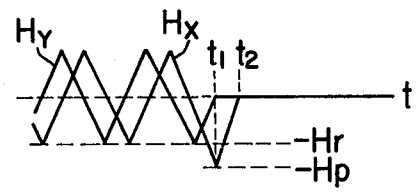
Figure 17A:
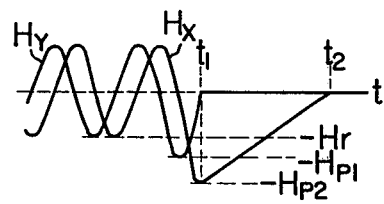
FIGS. 17A to 17H illustrate stop/start operations obtained through the combinations of the operations in FIGS. 16A and 16B with those in FIGS. 8 to 13A and 13B.
Figure 17B:
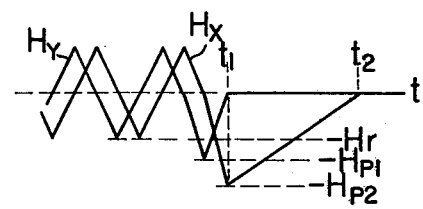
Figure 17C:
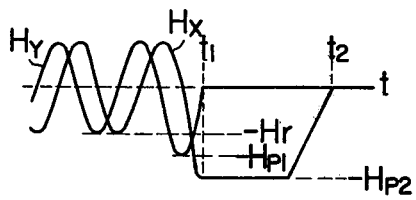
Figure 17D:
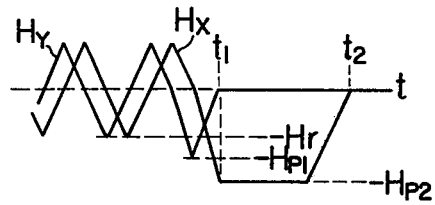
Figure 17E:
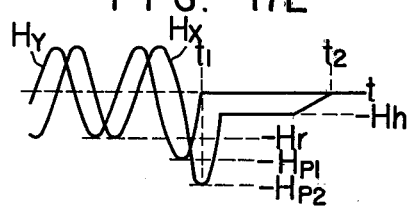
Figure 17F:
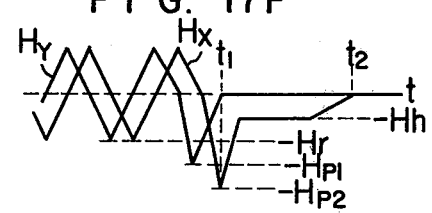
Figure 17G:
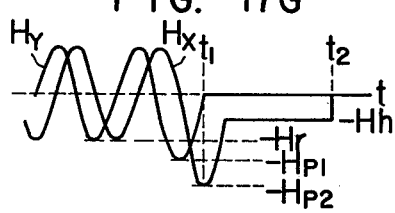
Figure 17H:
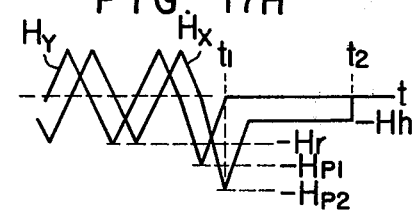

(5)—If some chips cannot be free from the decrease in the bias field margin even according to the methods described in the above items (2) to (4), the decrease in the margin in such chips can be prevented by making the magnitude of the in-plane magnetic field upon the cessation of rotation thereof larger than that at the normal operation, as shown in FIG. 14A or 14B.

(6)—The bias field margins of some chips which cannot be prevented from decreasing even by the method described in the above item (5), can be prevented from decreasing by combining the method in the above item (5) with the methods in the above items (2) to (4), as shown in FIGS. 15A to 15H.

(7)—If in a chip the margin cannot be prevented from decreasing even by resorting to the method described in the above item (6), the decrease can be eliminated by increasing a magnitude of the in-plane field at the phase 90° before the cessation of rotation thereof, as shown in FIGS. 16A and 16B.

(8)—If the method described in the above item (7) has no effect in decreasing the margin, the decrease can be prevented by combining the method in the above item (7) with the method in the above items (2) to (4), as shown in FIGS. 17A to 17H.

Figure 18A:
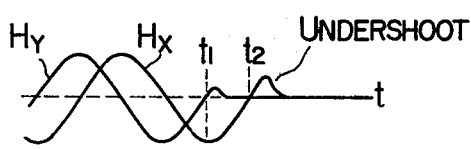
FIGS. 18A and 18B illustrate stop/start operations in the case where the sinusoidal magnetic field undershoots.
Figure 18B:
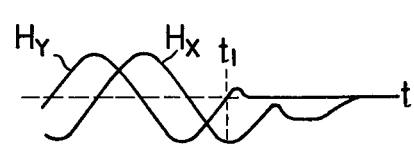

(9)—As shown in FIG. 18A, when the sinusoidal magnetic fields are put off, the fields are liable to undershoot owing to circuit characteristic. The undershooting of $H_Y$ at the time $t_1$ causes little decrease in the margin since $H_X$ is maximum at the time $t_1$, but the undershooting of $H_X$ at the time $t_2$ decreases the margin to a considerable extent since the undershooting forms a field in the opposite direction after the cessation of rotation. However, if a holding magnetic field is applied for a certain period, the undershooting of $H_X$ can be prevented from forming a reverse field, as shown in FIG. 18B, so that rather a large undershooting can be equivalently eliminated.

(10)—The decrease in the margin can be prevented by making a magnitude of the in-plane field at the transient start operation larger than that at the normal operation, as shown in FIG. 19A, 19B, 19C or 19D. This method may be combined any one of the abovedescribed methods.

As described above, the present invention, which has been made on the basis of the above facts obtained as a result of repeated experiments, aims at providing a field access magnetic bubble memory device having large allowances for chip and circuit and a short access time.

Now, the present invention will be described by way of embodiments.

EMBODIMENT I

Figure 20A:
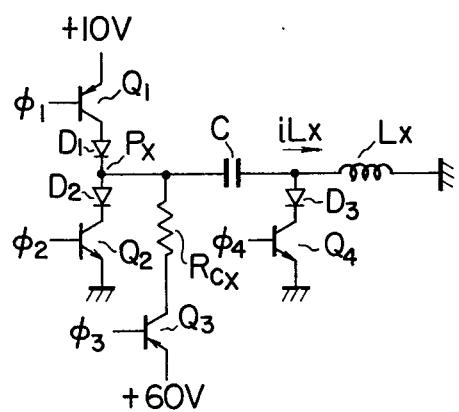
FIGS. 20A and 20B show circuits of a first embodiment of the present invention.
Figure 20B:
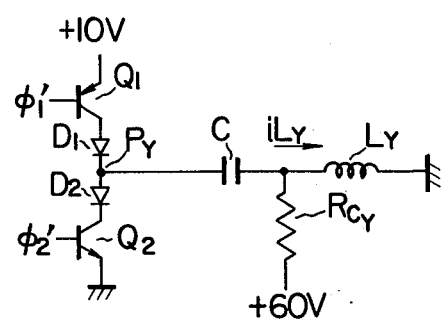
Figure 21:
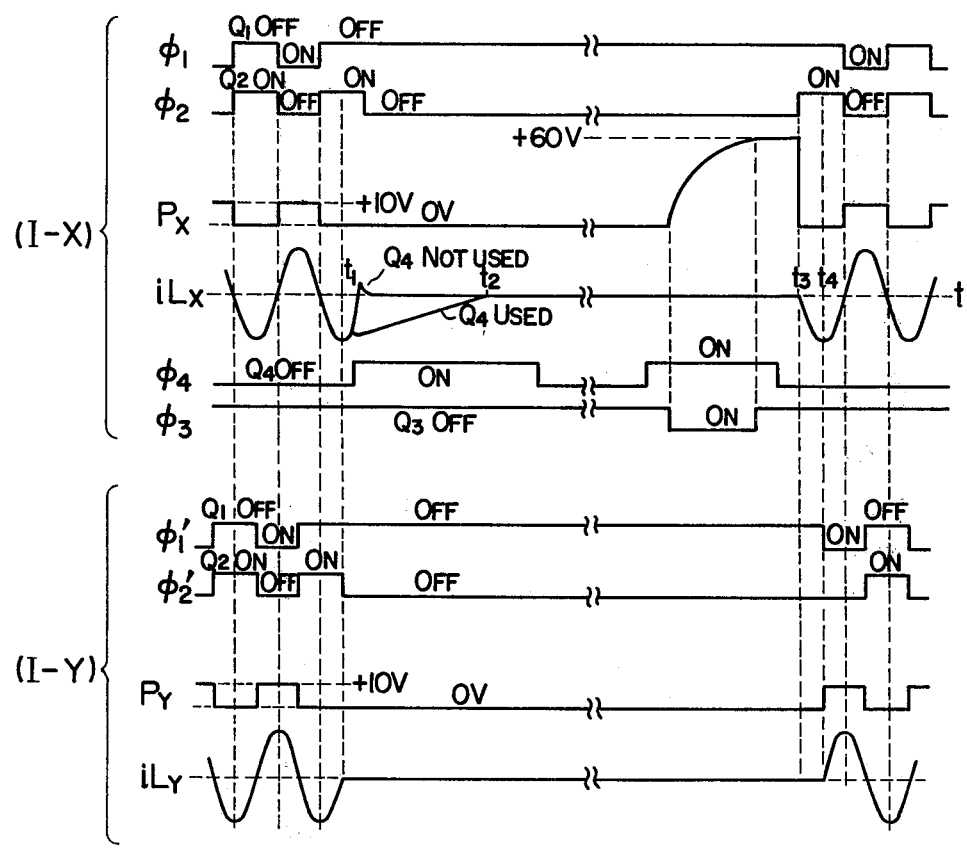
FIG. 21 shows waveforms appearing at various points in the circuits shown in FIGS. 20A and 20B.

FIGS. 20A and 20B respectively show in-plane magnetic field drive circuits for the X- and Y-directions, which perform in combination the operation as shown in FIG. 8. FIG. 21 shows waveforms useful in explaining the operation.

In FIG. 20A showing the X-direction drive circuit, transistors $Q_1$ and $Q_2$ are alternately rendered conductive in the normal operation to generate at a point $P_x$ a voltage having a rectangular waveform. An X-direction drive coil $L_x$ is connected in series with a resonance capacitor C to form a series resonance circuit which is connected with the point $P_x$. Voltage waveforms $\phi_1$ and $\phi_2$ shown in (I-X) of FIG. 21 are applied to the bases of the transistors $Q_1$ and $Q_2$, respectively. As seen from (I-X) of FIG. 21, the transistor $Q_2$ is turned on for the transient stop operation. When the current $iL_x$ through the coil $L_x$ reaches the negative maximum at the time $t_1$, a voltage $\phi_4$ is shifted up to be a positive level so that a transistor $Q_4$ is turned on. Thereafter, the voltage $\phi_2$ is reduced to zero to turn off the transistor $Q_2$. The resonance energy stored in the coil $L_x$ continues to be released as current through the transistor $Q_4$. The current gradually decreases and vanishes at the time $t_2$ due to resistance loss in circuit, as shown as $iL_x$ ($Q_4$ used) in FIG. 21. The circuit is so designed that $t_2$-$t_1$ may exceed the ¼ cycle of the normal operation. For the transient start operation, the transistor $Q_1$ is first turned on and then a transistor $Q_3$ is turned on, to cause the capacitor C to be charged so as to develop a voltage of +60V thereacross. Thereafter, the transistor $Q_3$ is cut off and after $Q_4$ is cut off, the transistor $Q_2$ is turned on at the time $t_3$ to start the resonance of the series resonance circuit.

In FIG. 20B showing the Y-direction drive circuit, such transistors as the transistors $Q_3$ and $Q_4$ shown in FIG. 20A are not used. In FIGS. 20A and 20B, equivalent components are indicated by similar reference characters. As shown in FIG. 21 (I-Y), the voltage waveforms $\phi_1'$ and $\phi_2'$ applied to the transistors $Q_1$ and $Q_2$ of the Y-direction drive circuit are 90° out of phase from the voltage waveforms $\phi_1$ and $\phi_2$, respectively.

Figure 22:
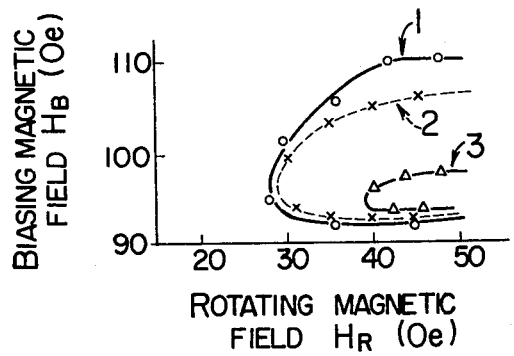
FIG. 22 shows in graphic representation the characteristics of the circuits in FIGS. 20A and 20B.

As a result, the dynamic margin characteristics are obtained as shown in FIG. 22, in which the curve 1 corresponds to the normal operation, the curve 2 to the case where the transistor $Q_4$ is used, and the curve 3 to the case where the transistor $Q_4$ is not used. The case where the transistor $Q_4$ is not used, is represented by the signal $iL_x$ ($Q_4$ not used) in FIG. 21 and in this case, the transistor $Q_4$ is not conducted at the transient stop operation. In this case, there exists about 5% of undershooting and the dynamic margin is very narrow as shown in FIG. 22. However, when the transistor $Q_4$ is operated, the dynamic margin roughly equal to that at the normal operation can be obtained through the upper limit at the stop/start operation is smaller by 4 ~ 5 [Oe].

Figure 23:
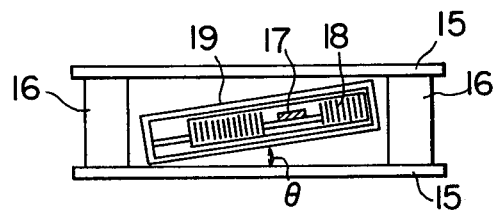
FIG. 23 shows in side view a module in which a memory chip is inclined to yoke plates.

Incidentally, by inclining the drive coils 18 and 19 with the memory chip 17 mounted therein, at an angle $\theta$ of about 2° to yoke plates 15 and by applying a constant in-plane magnetic field (about 3 [Oe] in the direction of the in-plane field upon the cessation of rotation thereof, the fall by 4 ~ 5 [Oe] of the upper limit of the margin at the stop/start operation can be prevented so that the margin at the stop/start operation substantially equal to that at the normal operation can be obtained. In FIG. 23, reference numeral 16 indicates a permanent magnet.

EMBODIMENT II

Figure 24:
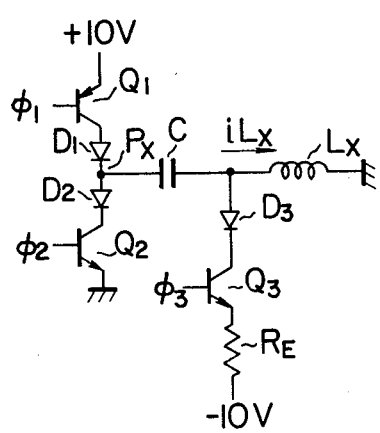
FIG. 24 shows a circuit of a second embodiment of the present invention.

FIG. 24 shows an in-plane magnetic field drive circuit for the X-direction which is suitable to perform such operations as shown in FIGS. 10 to 13. In this embodiment, an in-plane magnetic field drive circuit for the Y-direction may be the same as that shown in FIG. 20B.

Figure 25:
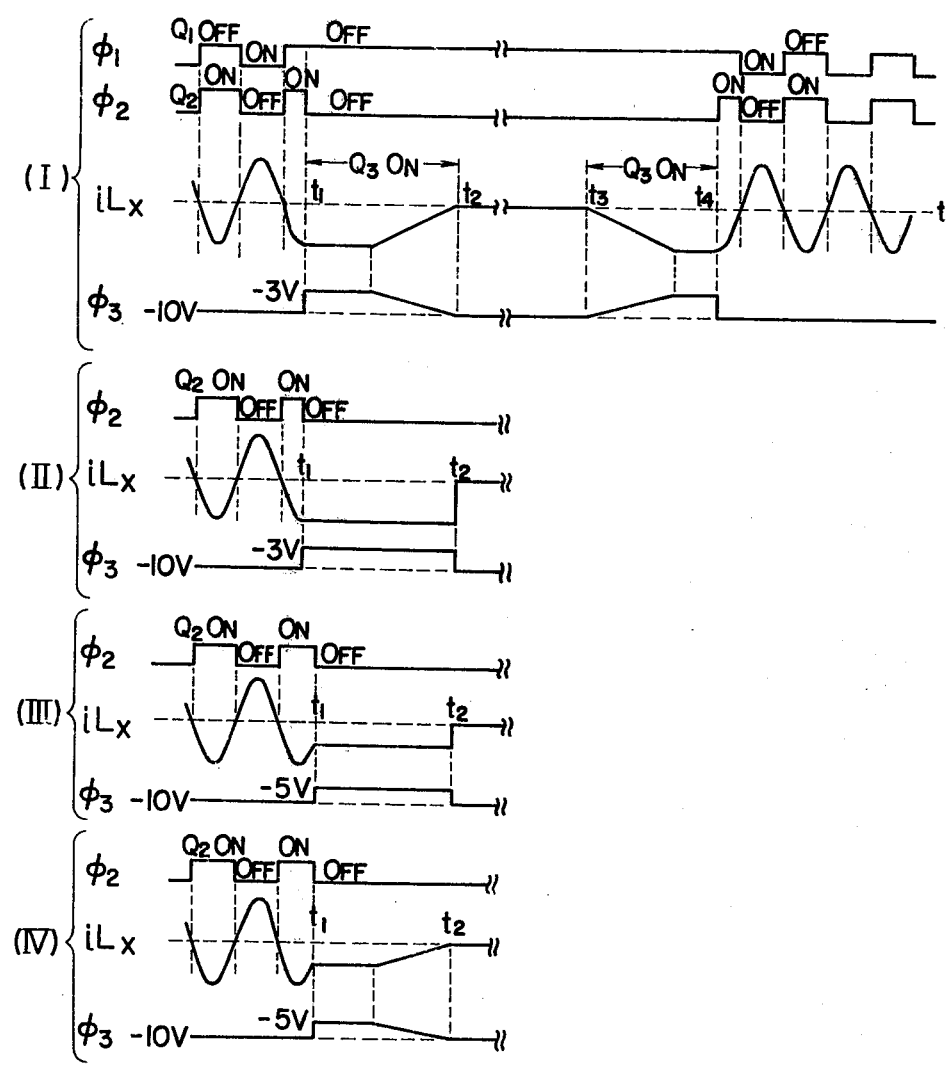
FIG. 25 shows waveforms useful in explaining the operation of the circuit shown in FIG. 24.

The in-plane field $H_x$ in FIG. 1 is applied or removed at the time at which the coil current vanishes and the capacitor voltage is maximum while the cessation and initiation of rotation of the in-plane field take place respectively at the times $t_1$ and $t_4$, as shown in FIG. 1. At those time instants, the capacitor voltage is zero and the coil current is maximum with respect to $H_X$. Accordingly, even if the transistors $Q_1$ and $Q_2$ are turned off at the time $t_1$ and the coil current flows through the transistor $Q_3$, no transient phenomenon takes place. In like manner, if the transistor $Q_3$ is turned on befor the time $t_4$ and cut off simultaneously with the start of operations of the transistors $Q_1$ and $Q_2$, no transient phenomenon can be observed. FIG. 24 shows a circuit for performing such an operation as above and FIG. 25 shows waveforms useful in explaining the operation of the circuit in FIG. 24. The circuit shown in FIG. 24 performs the operations shown in (I) to (IV) of FIG. 25, depending upon the period of conduction of the transistor $Q_2$ and the waveform of the voltage applied to the base of the transistor $Q_3$. (I) to (IV) of FIG. 5 correspond respectively to the operations shown in FIGS. 12, 10A, 11A and 13A. The circuit can produce a drive waveform suitable to the stop/start operation, as indicated at $iL_x$ in FIG. 25, and enjoy almost the same effect as in FIG. 22. With this circuit, the waveform of the current during the holding period at the start and stop operations can be arbitrarily determined. Only the restriction is that the current waveform is continuous at the times $t_1$ and $t_4$ and has no rapid change at those time instants.

In this case, too, the margin of the biasing field is increased by inclining the coils with the chip at an angle to the yoke plates, as shown in FIG. 23.

EMBODIMENT III

Figure 26:
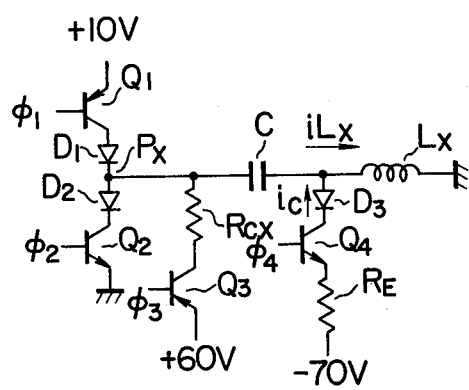
FIG. 26 shows a circuit of a third embodiment of the present invention.

FIG. 26 shows a circuit which is a combination of an in-plane field drive circuit for the X-direction, for performing the same operation as shown in FIG. 1 and a circuit for causing only pulse current to flow through the coil $L_x$ of the drive circuit. Thus, in this circuit, the pulse current is superposed on the coil current only during the transient stop operation. FIG. 27 shows waveforms useful in explaining the operation of the circuit shown in FIG. 26. The circuit in FIG. 26 is adapted to perform the operations shown in FIGS. 14A, 15A, 15C, 15E and 15G and actually performs one of the operations represented by the waveform diagrams in (I) to (V) of FIG. 27.

As shown in FIG. 27, the transistors $Q_1$ and $Q_2$ are alternately turned on at the normal operation and the transistor $Q_2$ is cut off at the time $t_2$ to reduce the coil current to zero (curve $iL_x$ labeled "$Q_4$ not used"). When a signal having a waveform $\phi_4$ is applied to the base of the transistor $Q_4$, a current having a waveform iC flows through the coil $L_x$ so that a drive current represented by solid curve at $iL_x$ is obtained. Just before the transient start operation the transistor $Q_3$ is turned on and after the polarity of the capacitor C has been inverted, the transistor $Q_2$ is turned on at the time $t_3$.

Figure 28:
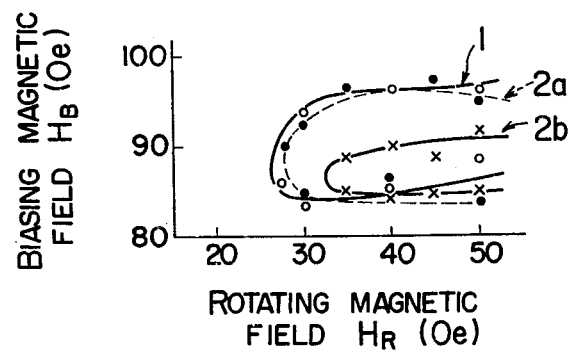
FIG. 28 shows in graphic representation the characteristic of the circuit in FIG. 26.
Figure 30:
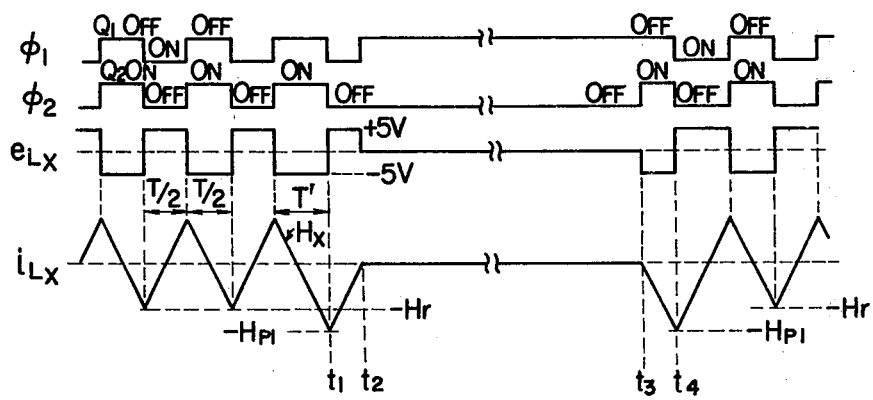
FIG. 30 shows waveforms useful in explaining the operation of the circuit in FIG. 29.
Figure 29:
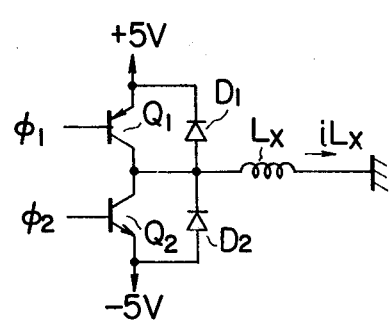
FIG. 29 shows a circuit of a fourth embodiment of the present invention.
Figure 31:
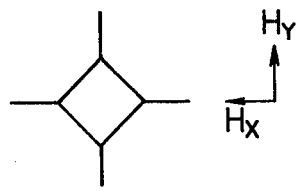
FIG. 31 illustrates a rotating magnetic field whose vector describes a pseudo-asteroid curve.
Figure 32:
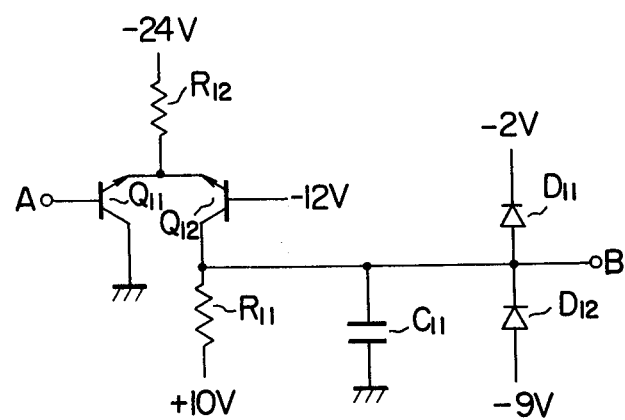
FIG. 32 shows a circuit for supplying the signal $\phi_3$ used in the circuit of FIG. 24.
Figure 33:
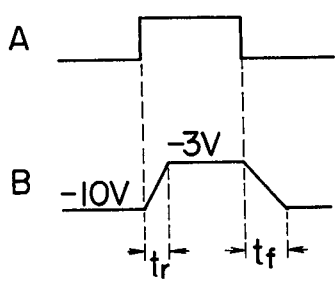
FIG. 33 shows waveforms of input and output signals in the circuit of FIG. 32.

The chip which had been subjected to a performance test, proved to have a bias field margin of about 10 [Oe], as shown by the curve 1 in FIG. 28, but it was not actuated during the start/stop operation in which transistor $Q_4$ is not actuated, the margin being zero. In the case where the coils with the chip mounted had no inclination (constant in-plane field $H_{in}$=O), different from the case shown in FIG. 23, a margin of about 5 [Oe] was obtained, as shown by the curve 2b in FIG. 28, by actuating the transistor $Q_4$. When the angle of inclination was about 2°, as in FIG. 23, and when a constant in-plane field of about 3 [Oe] was applied, the margin represented by the curve 2a in FIG. 28 was obtained which was almost the same as the margins at the normal operation.

Figure 19A:
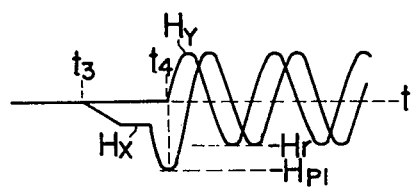
FIGS. 19A to 19D illustrate stop/start operations in which the in-plane field applied at the start operation has its magnitude larger than that at the normal operation.
Figure 19B:
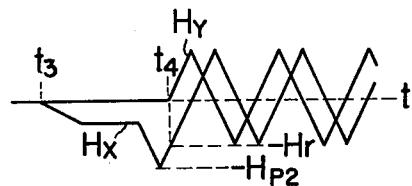
Figure 19C:
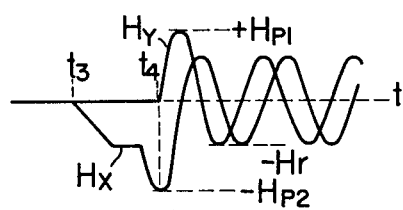
Figure 19D:
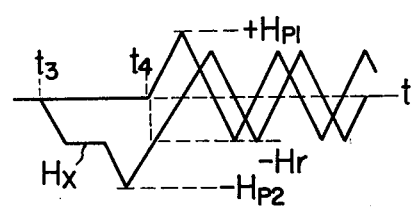

In this circuit, by changing the waveform $\phi_4$, the current iC can be superposed also at the transient start operation (as in the operations shown in FIGS. 19A and 19B). In another performance test, a margin of about 5 [Oe], which corresponds to the curve 2b in FIG. 28, was obtained when the pulse current had been superposed on the coil current at the stop/start operation.

Moreover, in this embodiment, a Y-direction magnetic field drive circuit, when constructed in the same constitution as in FIG. 26, can clearly perform one of the operations shown in FIGS. 16A, 17A, 17C, 17E and 17G.